US006272022B1

(12) United States Patent
Ferranti et al.

(10) Patent No.: US 6,272,022 B1
(45) Date of Patent: Aug. 7, 2001

(54) BRACKET ASSEMBLY WITH ENHANCED EMI CONTAINMENT

(75) Inventors: Stephen A. Ferranti, Rowlett; Jin He, Plano; Gregory P. Jorgenson, Quinlan, all of TX (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/438,986

(22) Filed: Nov. 12, 1999

(51) Int. Cl.[7] ...................................................... H05K 9/00
(52) U.S. Cl. .......................... 361/818; 361/802; 361/756; 174/35 R; 174/51 R
(58) Field of Search ..................................... 361/818, 676, 361/694, 695, 730, 752, 753, 756, 759, 740, 800, 801, 802; 174/35 R, 51 R

(56) References Cited

U.S. PATENT DOCUMENTS

| 4,356,531 | * | 10/1982 | Marino et al. | 361/384 |
| 4,759,466 | * | 7/1988 | Chase et al. | 220/306 |
| 4,780,570 | * | 10/1988 | Chuck | 174/35 GC |
| 5,673,029 | * | 9/1997 | Behl et al. | 340/635 |
| 5,788,566 | * | 8/1998 | McAnally et al. | 454/184 |
| 5,945,746 | * | 8/1999 | Tracewell et | 307/43 |
| 5,969,941 | * | 10/1999 | Cho | 361/687 |
| 6,018,464 | * | 1/2000 | Kim | 361/818 |
| 6,051,780 | * | 4/2000 | Fuhrmann et al. | 174/35 GC |
| 6,075,698 | * | 6/2000 | Hogan et al. | 361/695 |
| 6,185,097 | * | 2/2001 | Behl | 361/695 |

* cited by examiner

*Primary Examiner*—Jeffrey Gaffin
*Assistant Examiner*—Hung Bui
(74) *Attorney, Agent, or Firm*—Locke Liddell & Sapp LLP

(57) ABSTRACT

A housing for a power supply rectifier includes an enclosure having front and rear panels, top and bottom walls, and side walls. A bracket is attached to the enclosure and includes a plurality of projections for mating with a plurality of apertures contained in one or more of the walls of the enclosure. The projections are larger than the apertures, such that when pressure is applied to the bracket, the projections are forced into the apertures to form a seal to minimize EMI emissions from the enclosure. The bracket removably mounts a fan to the housing.

7 Claims, 7 Drawing Sheets

DETAIL FIG. 5

BRACKET ASSEMBLY WITH ENHANCED EMI CONTAINMENT

BACKGROUND OF THE INVENTION

Electronic equipment, particularly in the field of telecommunications, is generally housed within a chassis which is positioned on a shelf within a rack. The equipment such as, for example, switch mode rectifiers may generate undesirable heat, and therefore fans are required to be installed within the chassis to dissipate excessive heat buildup. Periodically, the fans must be replaced due to a limited life cycle of fan rotor bearings. Replacement of fans must be done in the field to minimize the time in which the rectifier is out of service. Field replacement therefore must be accomplished quickly and with a minimal effort on behalf of an installer to access and replace the fan assembly. A reduction in the number of screws mounting the fan assembly to the chassis helps achieve this goal. However, minimizing the number of screws or fasteners attaching the fan assembly to the chassis results in long lengths of overlapping metal seams between the fan assembly bracket and chassis. The fan assembly bracket and chassis interface becomes a major source of electromagnetic interface (EMI) emissions which are generated by the rectifier, especially in the case of high frequency switching power supplies. Typically, in switch mode rectifiers, a desired maximum seam length between fasteners is two inches, therefore, minimizing the number of fasteners which creates longer seams is not consistent with the goal of minimizing EMI emissions.

EMI emissions can be reduced by utilizing a gasket strip attached to the chassis to ensure good metal to metal contact between the chassis and fan assembly bracket, or additional grounding screws can be added to attach the fan assembly bracket to the chassis. However, the elimination of screws and not the addition of screws is desirable to minimize the effort to replace a fan in the field. Gaskets are costly and further add to the time required to replace a fan in the field.

A need has thus arisen for a fan assembly bracket which allows for easy replacement of the fan in the field while providing for enhanced EMI performance. Such a bracket must provide for easy access to the fan for fan replacement and reinstallation with a minimum number of screws to decrease installation time while providing for good metal to metal contact between the fan assembly bracket and chassis to minimize EMI emissions.

SUMMARY OF THE INVENTION

In accordance with the present invention, a housing for a switch mode rectifier is provided. The housing includes an enclosure having front and rear panels, top and bottom walls, and side walls. A bracket is attached to the enclosure and includes a plurality of projections for mating with a plurality of apertures contained in one or more of the walls of the enclosure. The projections are larger than the apertures, such that when pressure is applied to the bracket, the projections are forced into the apertures to form a seal to minimize EMI emissions from the enclosure.

In accordance with another aspect of the present invention, a bracket for removably mounting a fan to a housing is provided. The bracket includes a frame for receiving a fan. The frame includes a plurality of projections adapted to mate with apertures contained in two of the walls of the housing. The mating projections and apertures form a seal between the fan frame and the wall of the housing when pressure is applied to the frame. The seal minimizes EMI emissions from the housing.

In accordance with another aspect of the present invention, a system for reducing electromagnetic interference emissions is provided. The system includes a housing. A switch mode rectifier is mounted within the housing. A fan is further mounted to the housing utilizing a bracket for removably mounting the fan to the housing. Two of the housing walls includes a plurality of apertures. The bracket includes a plurality of projections adapted to mate with the apertures in the wall of the housing. The projections are larger than the apertures, such that when pressure is applied to the bracket, the projections are forced into the apertures to form a seal to thereby minimize EMI emissions from the housing.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DETAILED DESCRIPTION

Figure 1:
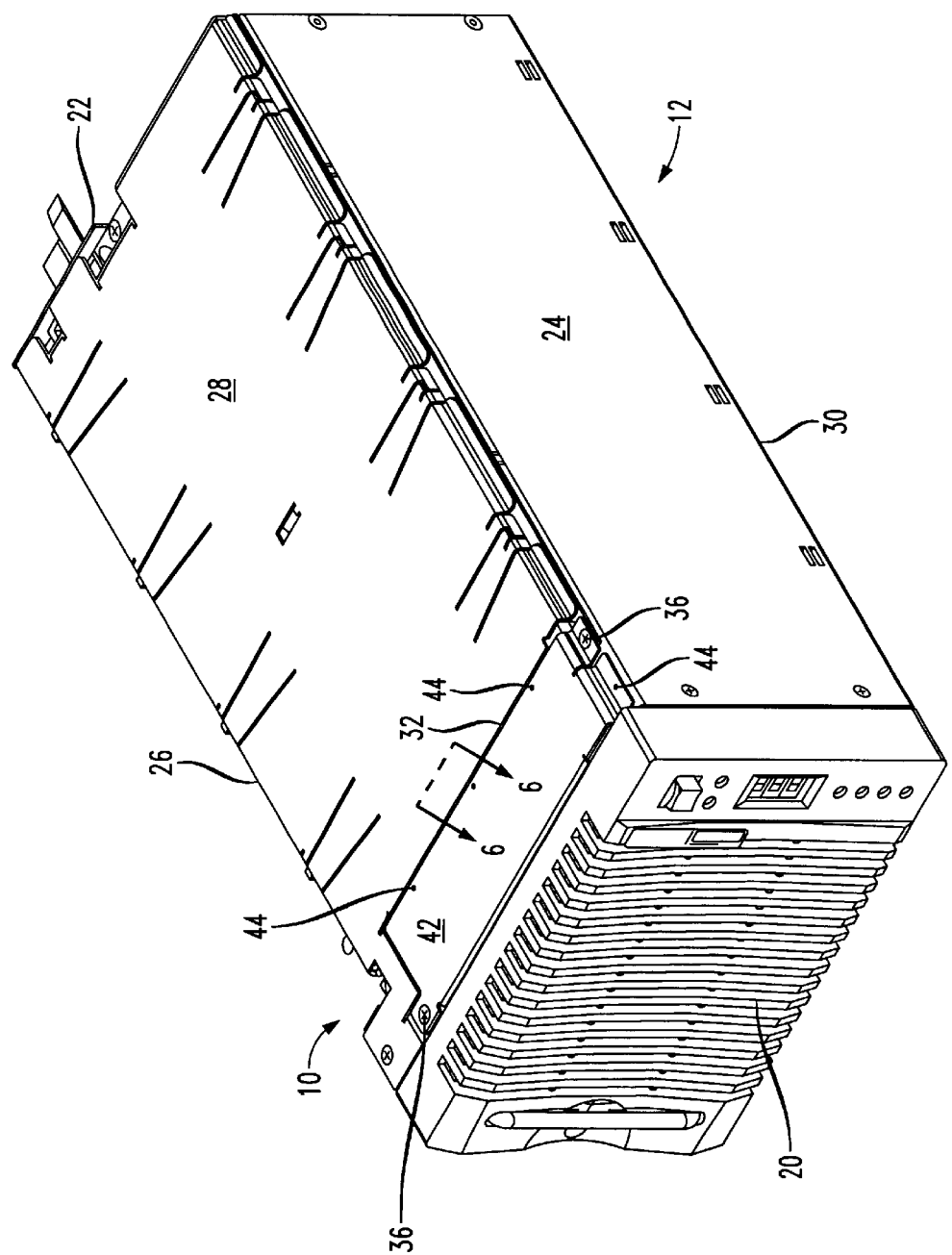
FIG. 1 is a perspective view of the present housing including the present bracket assembly in the installed position.
Figure 2:
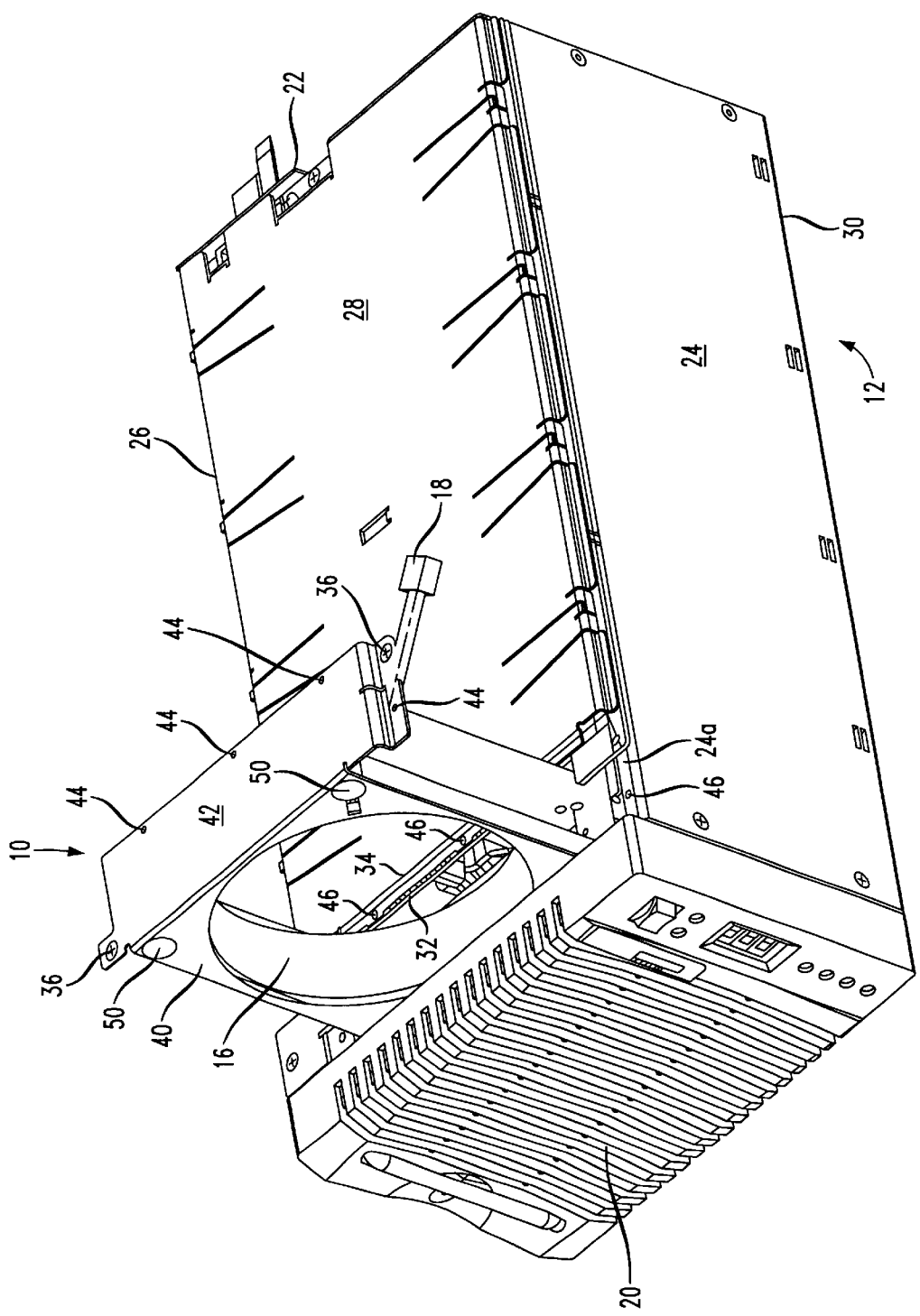
FIG. 2 is a perspective view of the present housing including the present bracket assembly partially removed from the housing.
Figure 3:
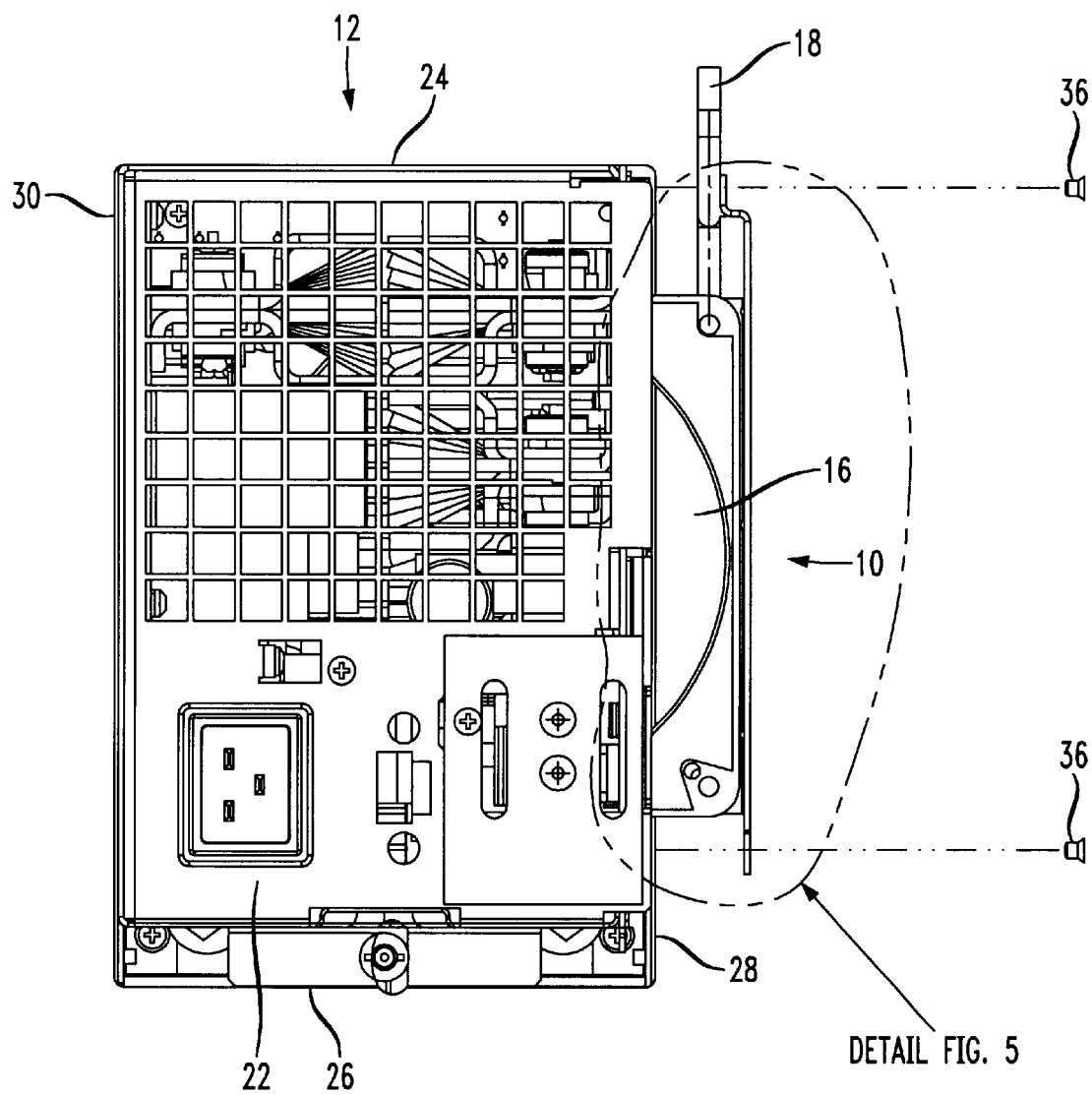
FIG. 3 is a rear elevational view of the present housing with the present bracket assembly partially removed.
Figure 4:
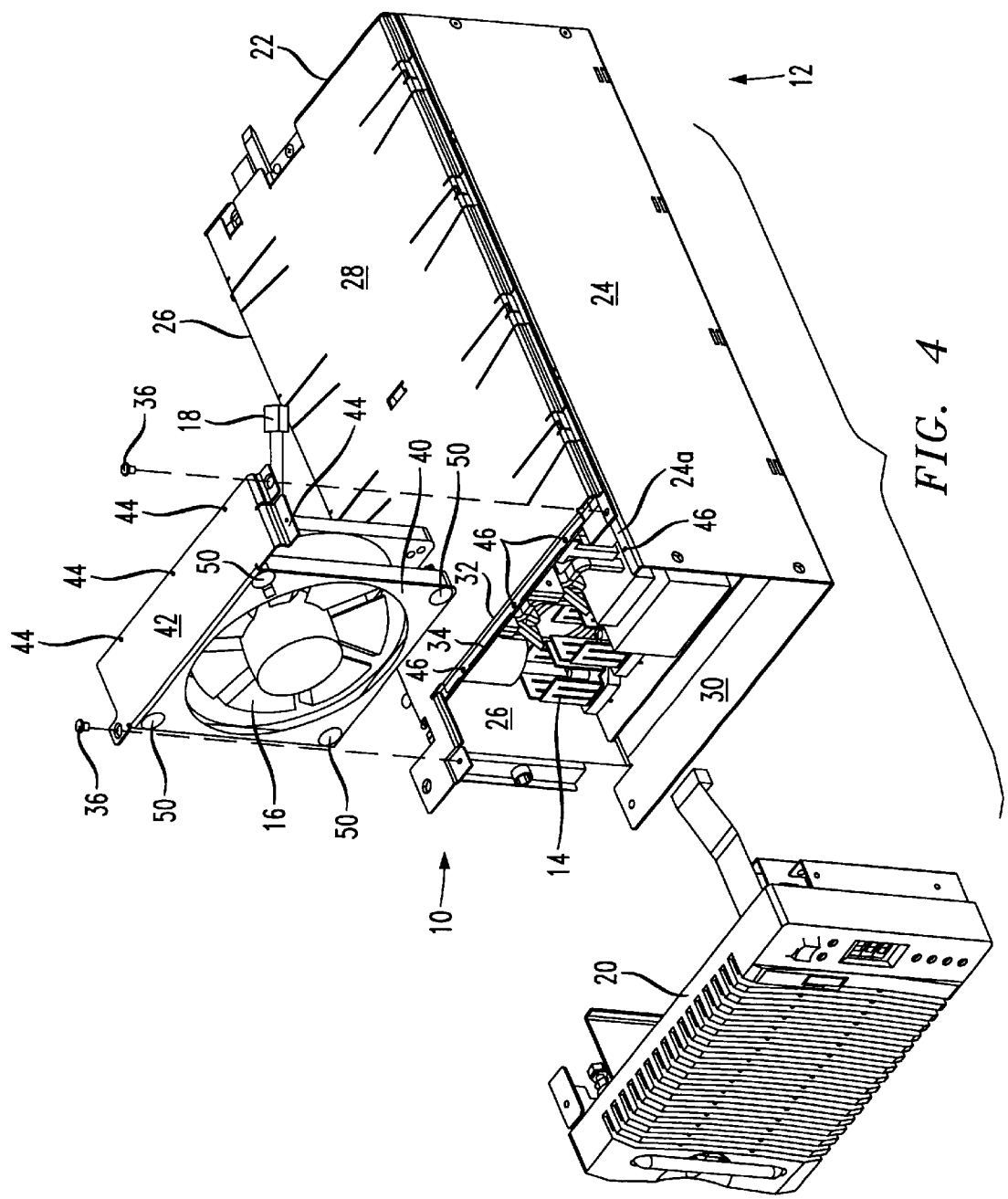
FIG. 4 is an exploded perspective view of the present housing and bracket.

Referring simultaneously to FIGS. 1–4, the present bracket assembly is illustrated, and is generally identified by the numeral 10. Bracket assembly 10 is replaceably and removably mounted to a chassis or housing 12 which houses electronic equipment such as, for example, a switch mode rectifier generally identified by the numeral 14 (FIG. 4). FIG. 1 illustrates bracket assembly 10 in the installed position, whereas FIG. 2 illustrates bracket assembly 10 partially removed from housing 12. Interconnected to bracket assembly 10 is a fan 16 having an electrical cable 18.

Housing 12 includes a front panel 20, rear panel 22, a top wall 24, a bottom wall 26, a first side wall 28, and a second side wall 30. Panels 20 and 22 and walls 24, 26, 28, and 30 form an integral structure for minimizing EMI emissions and may comprise, for example, metal, however, the positioning of bracket assembly 10 in side wall 28 creates a seam 32 between bracket assembly 10 and an edge 34 of side wall 28. Seam 32 provides a source of EMI emissions. The present invention provides for a seal for seam 32 to minimize EMI emissions from housing 12 as a result of using bracket assembly 10 for mounting fan 16.

As illustrated in FIGS., 1–4 bracket assembly 10 is mounted to housing 12 through side wall 28, it being understood that bracket assembly 10 can mount fan 16 through side wall 30 or through top wall 24 or bottom wall 26 as the design criteria dictates. Bracket assembly 10 is mounted to housing 12 utilizing fasteners such as, for example, screws 36. Only two screws 36 are required for mounting bracket assembly 10 to housing 12 thereby minimizing the installation time to access and replace a fan 16 in the field.

Figure 5:
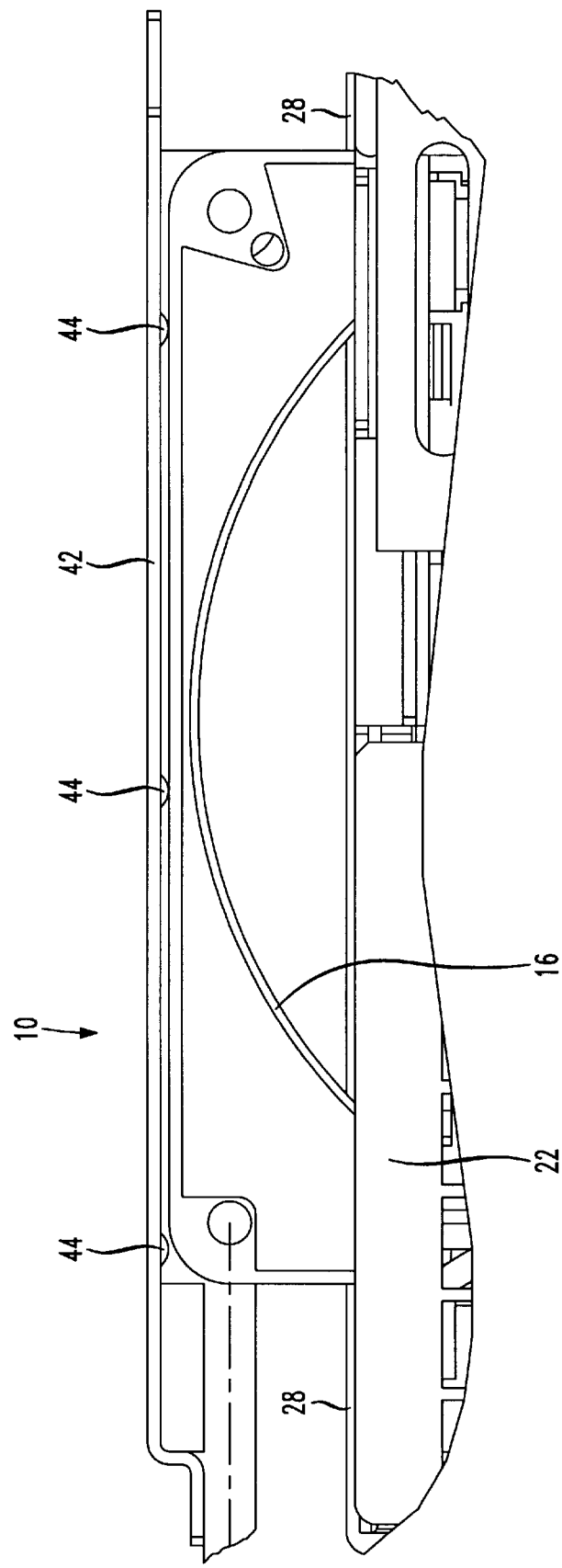
FIG. 5 is an enlarged elevational view of the detail illustrated in FIG. 3.
Figure 6:
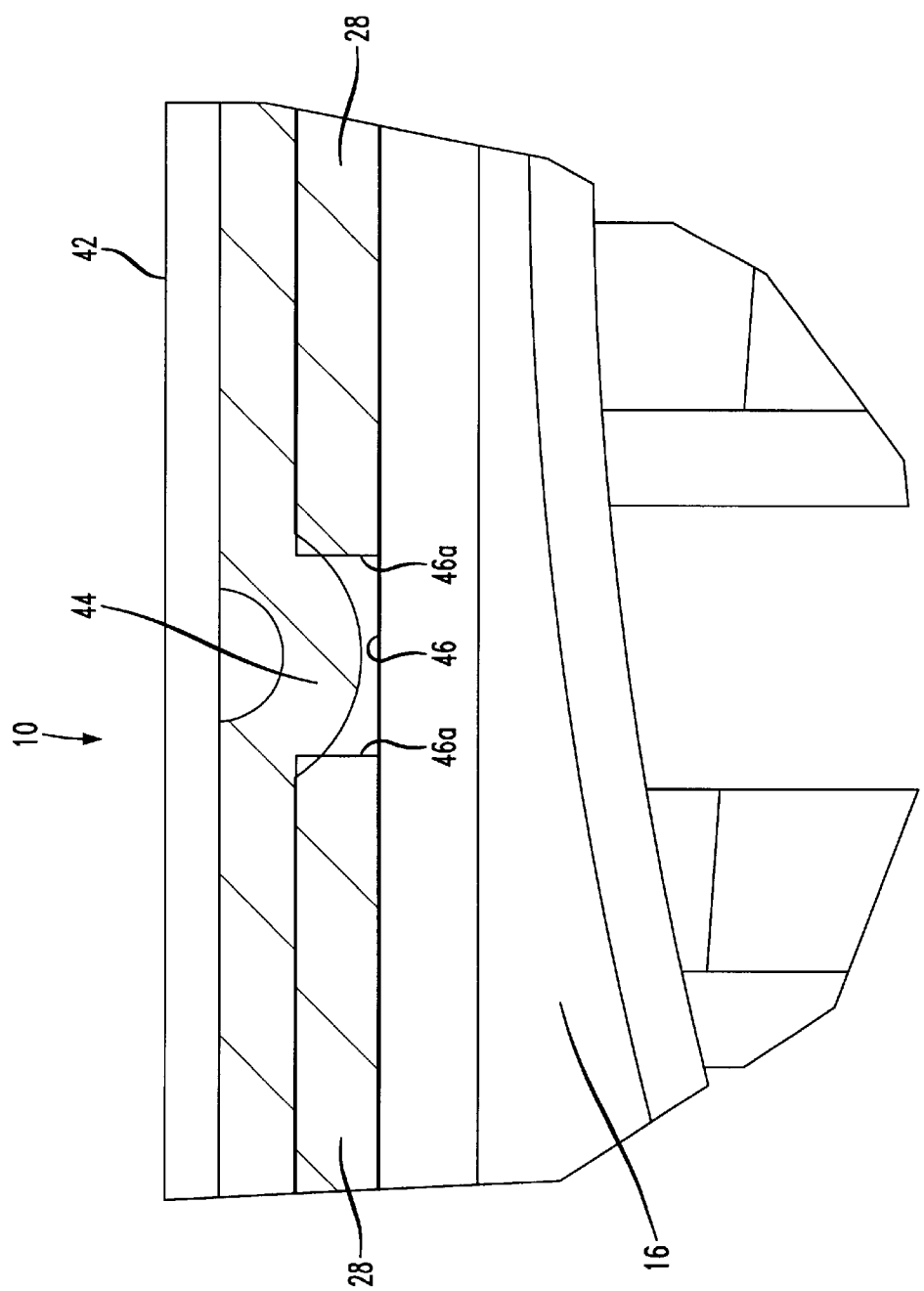
FIG. 6 is a sectional view taken generally along sectional lines 6—6 of FIG. 1.
Figure 7:
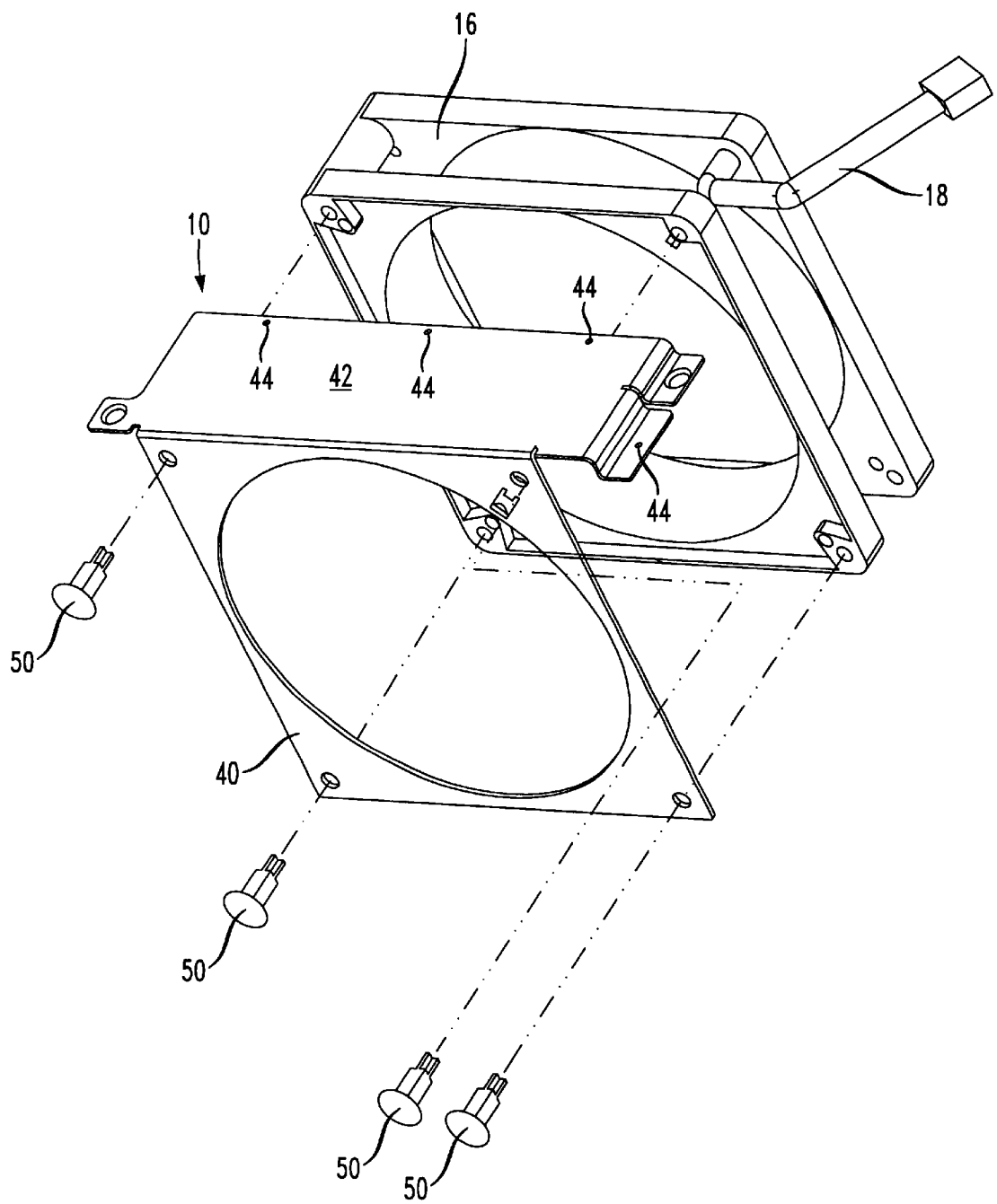
FIG. 7 is an exploded perspective view of a fan utilized with the present bracket assembly.

Referring to FIGS. 5–7, bracket assembly 10 includes a frame 40 having a top plate 42. As more clearly illustrated in FIG. 5, plate 42 includes a plurality of dimples or projections 44. Projections 44 are arcuate in shape and extend inwardly from plate 42. Side wall 28 of housing 12 includes a plurality of apertures 46. Edge 24a of top wall 24 includes an aperture 46. Projections 44 are aligned with apertures 46 when bracket assembly 10 is installed within housing 12. Projections 44 provide for proper indexing and alignment of bracket assembly 10 within housing 12. Projections 44 are larger in size than the diameter of apertures 46.

As illustrated in FIG. 6, when bracket assembly 10 is installed within housing 12 by fastening screws 36, screws 36 are torqued to apply pressure to plate 42 to thereby force projections 44 into apertures 46. The interconnection between projections 44 and side wall 28 and top wall 24 via apertures 46 provides for an interference fit ensuring that edges 46a of apertures 46 engage projections 44, providing for complete contact around projections 44. The interference fit between projections 44 and apertures 46 of side wall 28 and top wall 24 creates a seal along seam 32 thereby providing good metal to metal contact between bracket assembly 10 and side wall 28 and top wall 24 of housing 12 thereby minimizing EMI emissions from housing 12. The seal created between plate 42 and side wall 28 and top plate 24 eliminates the need for an EMI gasket or additional grounding screws for mounting bracket assembly 10 to housing 12 thereby minimizing cost and added labor. Screws 36 provide sufficient pressure for forcing projections 44 into apertures 46 and thereby achieve sufficient EMI contact to seal seam 32.

As illustrated in FIG. 7, frame 40 of bracket assembly 10 is attached to fan 16 using fasteners 50.

It therefore can be seen that the present invention provides for a field replaceable fan mounting bracket having enhanced properties of an EMI gasket or grounding tab. The present bracket allows for easy installation of a fan assembly with a reduced number of screws for mounting the fan assembly to a housing while reducing the problem of EMI emissions.

Whereas the present invention has been described with respect to specific embodiments thereof, it will be understood that various changes and modifications will be suggested to one skilled in the art and it is intended to encompass such changes and modifications as fall within the scope of the appended claims.

What is claimed is:

1. A housing for a switch mode rectifier, the rectifier providing a source of electromagnetic interference emissions, the housing comprising:
   an enclosure having a front panel, a rear panel, a top wall, a bottom wall, said top and bottom walls disposed generally perpendicular to said front and rear panels, a first side wall and a second side wall, said side walls disposed generally perpendicular to said top and bottom walls;
   one of said housing walls including a plurality of circular apertures having edges; and
   a bracket attached to said enclosure, said bracket including a plurality of projections for mating with said plurality of wall apertures, said projections being larger than said wall apertures and said projections having an arcuate shape, such that when pressure is applied to said bracket, said projections are forced into said plurality of wall apertures to engage said aperture edges thereby forming a seal to minimize EMI emissions from said enclosure between said bracket and enclosure wall.

2. The housing of claim 1 and further including;
   a fan mounted to said bracket and wherein said bracket removably mounts said fan to said enclosure.

3. A housing for a switch mode rectifier, the rectifier providing a source of electromagnetic interference emissions, the housing comprising:
   a metal enclosure having a front panel, a rear panel, a top wall, a bottom wall, said top and bottom walls disposed generally perpendicular to said front and rear panels, a first side wall and a second side wall, said side walls disposed generally perpendicular to said top and bottom walls;
   at least one of said housing walls including a plurality of circular apertures having edges; and
   a bracket attached to said enclosure, said bracket including a plurality of projections for mating with said plurality of wall apertures, said projections being larger than said wall apertures and said projections having an arcuate shape, such that when pressure is applied to said bracket, said projections are forced into said plurality of wall apertures to engage said aperture edges thereby forming a seal to minimize EMI emissions from said enclosure between said bracket and enclosure wall.

4. The housing of claim 3 and further including;
   a fan mounted to said bracket and wherein said bracket removably mounts said fan to said enclosure.

5. A bracket for removably mounting a fan to a housing, the housing having a wall including a plurality of circular apertures having edges, the bracket comprising:
   a frame adapted to receive the fan, said frame including a plurality of arcuate projections adapted to mate with the plurality of apertures in the wall of the housing to engaging said aperture edges thereby forming a seal between said frame and the wall of the housing when pressure is applied to said frame, said seal minimizing EMI emissions from the housing.

6. A bracket for removably mounting a fan to a housing, the housing having a plurality of walls including a plurality of circular apertures having edges, the bracket comprising:
   a frame adapted to receive the fan, said frame including a plurality of arcuate projections adapted to mate with the plurality of apertures in the walls of the housing to engage said aperture edges thereby forming a seal between said frame and the walls of the housing when pressure is applied to said frame, said seal minimizing EMI emissions from the housing.

7. A system for reducing electromagnetic interference (EMI) emissions comprising:
   a metal housing having a front panel, a rear panel, a top wall, a bottom wall, said top and bottom walls disposed generally perpendicular to said front and rear panels, a first side wall and a second side wall, said side walls disposed generally perpendicular to said top and bottom walls;
   a power supply mounted in said housing and providing a source of electromagnetic interference emissions;
   a fan;

a bracket for removably mounting said fan to said housing;

one of said housing walls including a plurality of circular apertures having edges; and said bracket including a plurality of arcuate projections for mating with said plurality of wall apertures, said projections being larger than said wall apertures, such that when pressure is applied to said bracket, said projections are forced into said plurality of wall apertures to engage said aperture edges thereby forming a seal to minimize EMI emissions from said housing between said bracket and said housing wall.

* * * * *